Figure 1:
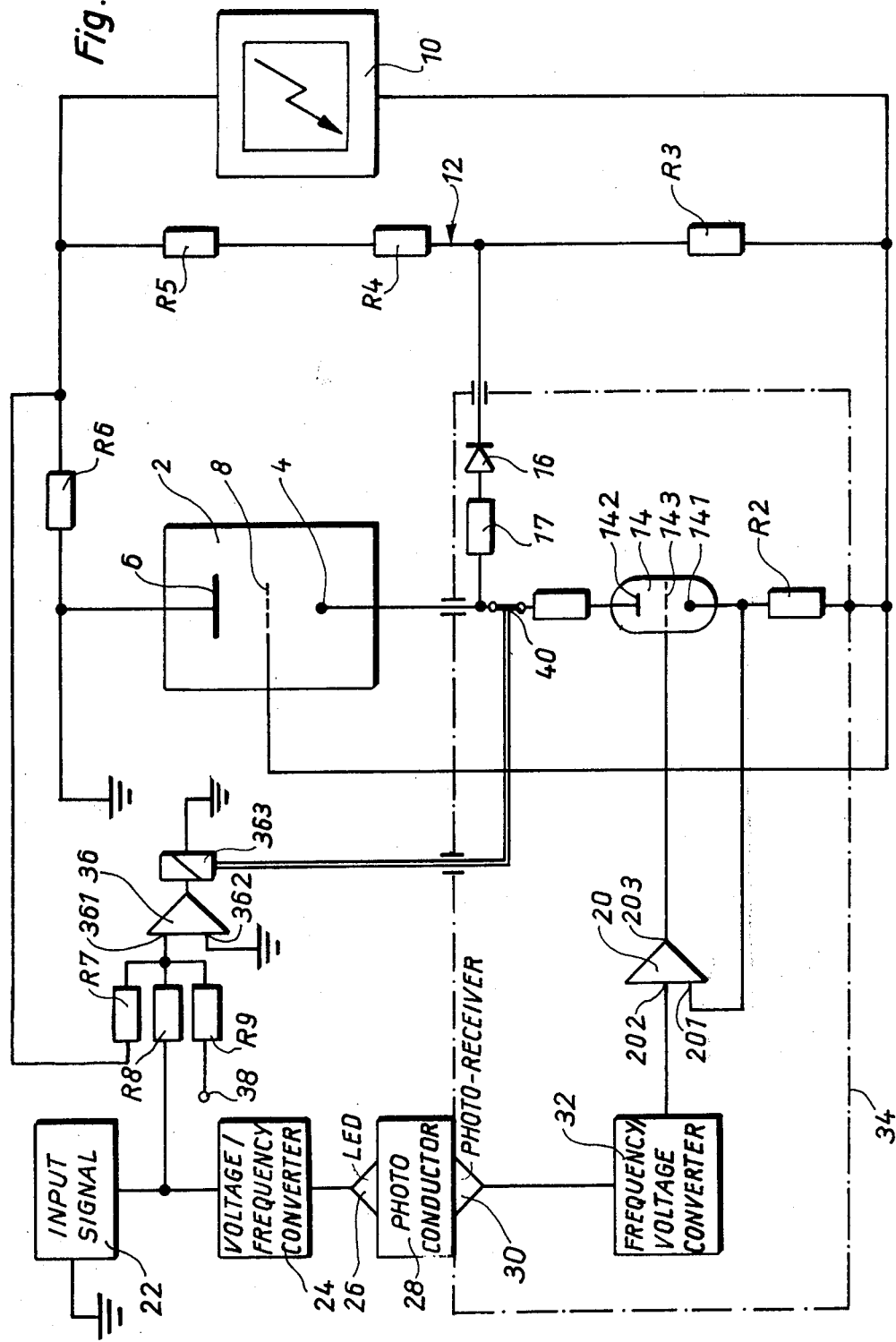

United States Patent

Mayer

[11] 3,999,032
[45] Dec. 21, 1976

[54] CURRENT CONTROL IN AN ELECTRON BEAM WELDER

[75] Inventor: Rolf Mayer, Stuttgart, Germany

[73] Assignee: Institut fur Kerntechnik und Energiewandlug e.V., Stuttgart, Germany

[22] Filed: Dec. 15, 1975

[21] Appl. No.: 640,448

[30] Foreign Application Priority Data

Dec. 20, 1974 Germany .......................... 2460424

[52] U.S. Cl. .......................... 219/121 EB; 315/306
[51] Int. Cl.² ...................................... B23K 15/00
[58] Field of Search .............. 219/121 EB, 121 EM; 315/297, 306, 307, 310, 311; 323/64, 66; 328/225, 267

[56] References Cited

UNITED STATES PATENTS

| | | | |
|---|---|---|---|
| 3,177,434 | 4/1965 | Hansen | 315/306 X |
| 3,454,830 | 7/1969 | Ranby et al. | 315/311 |
| 3,678,334 | 7/1972 | Dugdale et al. | 219/121 EB X |

Primary Examiner—J. V. Truhe
Assistant Examiner—G.R. Peterson
Attorney, Agent, or Firm—Hans Berman

[57] ABSTRACT

A beam generating tube in a welder has an anode connected to ground potential and a cathode-Wehnelt electrode circuit connected across a portion of a voltage divider which is connected to a high voltage source. The voltage drop across the portion of the voltage divider is varied by means of a control tube connected in parallel with that portion, the voltage at the control electrode of the control tube being varied as a function of the difference between the actual beam current and the desired beam current as set externally. A diode is connected from the cathode of the beam generating tube to the voltage divider tap so that the voltage drop across the control tube is limited when the welder is not in operation and no current flows from the voltage divider tap to the control tube when the welder is in operation. When the difference between the actual beam current and the desired beam current exceeds a predetermined difference, the energization of the beam generating tube is interrupted.

12 Claims, 2 Drawing Figures

CURRENT CONTROL IN AN ELECTRON BEAM WELDER

The present invention relates to a control circuit for controlling the beam current in the beam furnishing tube in an electronic welder, wherein the beam furnishing tube is constructed as a triode having an anode connected to ground potential, a Wehnelt electrode connected to the high voltage terminal, and a cathode connected to the voltage age divider tap of a voltage divider connected in parallel with the high voltage source. In particular, it relates to such welders wherein the cathode-control electrode voltage, that is the voltage determining the amplitude of the beam current, is controlled from an external source having at least one terminal connected to ground potential.

In known equipment of this type, the voltage difference between the cathode and the Wehnelt electrode is effected by changing the resistance in the cathode circuit step by step by means of a step motor. Since the resistance in the cathode circuit constitutes a negative feedback resistance, the known circuit has a certain amount of automatic self-stabilization. However, it has a number of disadvantages. First, the inertia of the mechanical parts makes it impossible to rapidly adjust and readjust the current in the beam. Further, the resistances can be adjusted only step by step, thereby not permitting an exact adjustment of the beam current. Further, when the beam current is disconnected step by step, it is possible that faults will appear in the welded seam due to piping or cavitation.

It is an object of the present invention to furnish a continuously controllable electron beam welder which operates substantially without inertia and in a safe and reliable manner.

In accordance with the present invention, control apparatus is provided for an electronic welder having a source of high voltage, a voltage divider connected in parallel with said source of high voltage, said voltage divider having a tap, and beam furnishing means having an anode connected to the second output terminal of said source of high voltage, a control electrode connected to the first output terminal of said source of high voltage, and a cathode connected to said tap of said voltage divider. The control apparatus comprises controllable impedance means connected in parallel with the cathode-control electrode circuit of said beam furnishing means, said controllable impedance having an impedance varying as a function of an impedance control signal applied to the impedance control electrode thereof. Desired beam current signal furnishing means furnish a desired beam current signal indicative of the desired beam current. Actual beam current signal furnishing means furnish an actual beam current signal indicative of the actual current in the beam furnished by said beam furnishing means. The actual beam current signal and the desired beam current signal are applied to a comparator whose output is connected to the impedance control electrode. The comparator furnishes the impedance control signal to the impedance control electrode as a function of the difference between the actual beam current signal and the desired beam current signal.

In a preferred embodiment of the present invention, the controllable impedance means is an electron tube, the internal impedance of said tube (i.e. the cathode-anode impedance) being variable as a function of the voltage applied to the impedance control electrode. The Wehnelt voltage of the beam furnishing tube can thus be adjusted by varying the internal impedance of the electron tube. In a preferred embodiment of the present invention, the voltage divider is proportioned in such a manner that the voltage drop across the portion in parallel with the cathode-Wehnelt electrode circuit is the blocking voltage for the beam furnishing tube when the electron tube constituting the controllable impedance is adjusted to a blocked (infinite impedance) state. As the Wehnelt voltage is decreased, the beam current flows in the main through the anode-cathode circuit of the electron tube. The actual beam current signal is then derived from a resistor connected in series with the electron tube, that is a voltage corresponding to the voltage across said resistor constitutes the actual beam current signal.

If the cathode of the beam furnishing tube were directly connected to the tap of the voltage divider, a portion of the current through the voltage divider could flow through the electron tube, so that a small error might be introduced in the actual beam current signal by the additional voltage drop generated by this additional current. Therefore, in a preferred embodiment of the present invention, a diode is inserted as unidirectional conducting means between the cathode of the beam furnishing tube and the voltage divider tap. The polarity of the diode is such that no current flows therethrough when the voltage at the voltage divider tap is more positive than that at the cathode of the beam furnishing tube. This connection has the further advantage that the Wehnelt voltage is restricted to a predetermined value determined by the relationship of the resistors in the voltage divider when the electron tube is blocked, this value being independent of the relationship between the internal impedance of the electron tube and that of the beam furnishing tube when both of these tubes are blocked. Thus, the electron tube is safeguarded against voltage breakthrough. On the other hand, when the internal impedance of the electron tube decreases, the current therethrough is strictly the beam current without any additional current from the voltage divider. Thus, the voltage drop across the resistor connected in series with the electron tube is directly proportional to the actual beam current.

It is a further advantage of the present invention that the desired beam current signal furnishing means can be selected from a wide range of apparatus furnishing many different kinds of characteristics. The desired beam current signal furnishing means comprise input voltage furnishing means which may furnish either a constant voltage or a constant voltage modulated by a timed voltage which has a controllable leading and trailing edge. Thus, the rise and drop in the electron beam current can be controlled in an adjustable manner. Further, the input voltage furnishing means may be pulse generator means or the constant voltage may be modulated by other voltages which have high frequency components or any desired variation of amplitude with respect to time. Thus, the melting and hardening process during the welding operation can be controlled in a wide variety of ways. Faults in the welding seam can thereby be avoided. The use of a pulse generator as a desired beam current signal furnishing means allows the beam current to be applied in a pulsating manner. This type of welding control is particularly desirable prior to a final welding process when there is danger of deformation of the workpiece due to high temperatures resulting from a continuously applied high welding current.

In a preferred embodiment of the present invention, the input voltage, which may be modulated as explained above, is applied to a voltage-frequency converter, or, alternatively, to an analog/digital converter. The resulting converter output voltage is applied to light emitting means, such as a light emitting diode or set of diode, whose output is applied, through one or more photo conductors, to a photo receiver. A preferred photo conductor is a glass rod which is disposed in an insulating oil tank. Specifically, the photo conductor comprises a glass rod having a high index of refraction and surrounded by a totally reflecting layer of synthetic resin material having a low index of refraction. Without this layer of synthetic material, a total reflection at the surface of the photo conductor and thus the effective transmission of light through the insulating oil tank would not be possible because of the normally high index of refraction of the oil.

In a further preferred embodiment of the present invention, a short time switching to a beam of very low intensity is substituted for the pulsed decrease of current in the electron beam. With such a low intensity beam, the beam can be utilized for scanning the weld. Further, in accordance with another preferred embodiment of the present invention, the desired beam current signal furnishing means operate in response to the current penetrating through the workpiece, that is the current which, during the welding process, appears behind the workpiece. For this application, the desired beam current signal furnishing means furnish an input voltage which varies as a function of this current. This type of arrangement is particularly appropriate for welding workpieces having walls of varying thickness.

In a further preferred embodiment of the present invention, an overcurrent protection circuit is furnished which interrupts the beam current when the difference between the actual beam current signal and the desired beam current signal exceeds a predetermined difference. This difference may be adjustable. Specifically, the threshold value applied to a comparator, to which is also applied the difference between the desired beam current signal and the actual beam current signal, is varied. For additional safety, the threshold value may vary as a function of the current through the beam furnishing tube.

Figure 2:
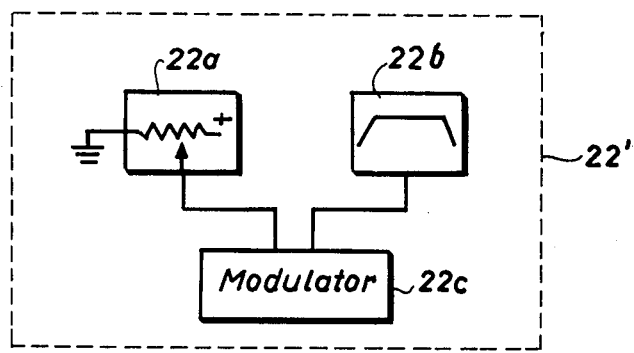

Other features, additional objects, and many of the attendant advantages of this invention will readily be appreciated as the same becomes better understood from the following detailed description of a preferred embodiment when considered in connection with the appended drawing wherein:

FIG. 1 is a schematic diagram of a preferred embodiment of the present invention; and FIG. 2 shows modified input voltage furnishing means for the apparatus of FIG. 1.

As is shown in FIG. 1, the beam furnishing means 2 of an electron beam welding apparatus is a triode having a cathode 4, an anode 6, and a Wehnelt cathode 8 as the control electrode. Anode 6 is connected to ground potential while the Wehnelt electrode 8 is connected to a first output terminal of a source 10 of high DC voltage. Connected across voltage source 10 is a voltage divider 12 comprising resistors R3, R4, R5, R6. Cathode 4 is connected to the tap of voltage divider 12 through a diode 16 and a resistor 17. The voltage divider tap is connected to one terminal of resistor R3 whose other terminal is connected to the first output terminal of voltage source 10. As controllable impedance means, an electron tube 14 has an anode-cathode circuit of variable impedance connected between cathode 4 and Wehnelt electrode 8, tube 14 having an impedance control electrode 143, a cathode 141, and an anode 142. Cathode 141 is connected to control electrode 8 through a resistor R2 as actual beam current signal furnishing means. The cathode 141 is also connected to the input 201 of a comparator 20 whose other input 202 is connected to receive the desired beam current signal. The output 203 of comparator 20 is connected to impedance control electrode 143.

Anode 6 is connected through resistor R6 of voltage divider 12 to the second output terminal of high voltage source 10 which furnishes a DC voltage positive with respect to the voltage at the first output terminal.

The main voltage drop of voltage divider 12 occurs across resistor R4 which is a high ohmic resistor. Resistor R5 is used for voltage measurement and has a substantially smaller resistance than resistor R4. The resistance value of resistor R3 is so chosen that, when tube 14 is blocked, the blocking potential for tube 2 is developed thereacross. For a Wehnelt tube, this blocking voltage is approximately —2 kV. Thus, if high voltage source 10 furnishes a voltage of a 150 kV, and the current flow through voltage divider 12 is approximately 4 mA, then the following resistance values would be appropriate:

$R3 = 550$ k $\Omega$
$R4 = 37.5$ M $\Omega$

As long as tube 14 is blocked, diode 16 limits the potential difference between cathode 141 and anode 142 of tube 14 to a value of approximately 2 kV, independent of the relationship of the internal impedance of tube 14 to that of tube 2 when both of these tubes are blocked.

The amplitude of the current through tube 2 is controlled by the potential difference existing between cathode 4 and control electrode 8. This potential difference is adjusted by means of the internal impedance of tube 14. The latter in turn varies as a function of the control signal applied to its control electrode 143. As soon as the Wehnelt voltage (i.e. the potential difference between cathode 4 and control electrode 8) drops below the blocking voltage, diode 16 blocks the current flow from resistor R4 to tube 14 so that only the actual beam current passes through tube 14. Since resistor R2 is connected in series with the cathode of tube 14, the voltage drop across resistor R2 is directly proportional to the amplitude of the beam current and constitutes an actual beam current signal which is applied to input 201 of comparator 20. As previously mentioned, the second input 202 of comparator 20 is energized by the desired beam current signal.

The desired beam signal furnishing means include units 22, 24, 26, 28, 30, and 32 in FIG. 1. In a preferred embodiment of the present invention, unit 22 furnishes an analog voltage having an adjustable amplitude. Connected to the output of voltage furnishing unit 22 is a voltage/frequency converter which converts the voltage applied thereto to a signal having a frequency varying as a function of the amplitude of the applied voltage. This signal is in turn applied to a light emitting diode 26. The signal from light emitting diode 26, which is a frequency modulated light, is applied through an insulated photo conductor arrangement 28 to a photo transistor 30 located in the high voltage portion of the equipment. Photo transistor 30 converts the received frequency-modulated light signal into a frequency-modulated electrical signal. This electrical frequency-modulated signal is applied to the input of a frequency/voltage converter 32, and the resulting amplitude modulated electrical signal constitutes the desired beam current signal.

It should be noted that the input voltage furnishing means are connected to ground potential so that the operator is not endangered by changing the input voltage even during operation of the equipment.

Alternate embodiments are, of course, possible. For example, an alternate embodiment of the voltage furnishing means is shown in FIG. 2. A constant voltage is applied by means of a potentiometer 22a to a modulator 22c. The signal from unit 22a is modulated there by a timed voltage generated in a function generator 22b. The leading edge and trailing edge of this voltage have adjustable slopes. The output signal of modulator 22c thus provides an input voltage which has a leading and trailing edge with a slope as determined in unit 22b and a level as determined in unit 22a. The output of modulator 22c is applied to unit 24 shown in FIG. 1.

The input voltage furnishing means may also be a pulse generator, conventional in itself.

The desired beam signal furnishing means may also include means furnishing, as an input voltage, a digital signal to a set of light-emitting diodes whose output is applied by photo conductors 28 to photo transistors 30 equal in number to the number of bits in the binary signal. Unit 32 for this embodiment would be replaced by a digital/analog converter.

For additional safety, an overcurrent protection circuit is included in the present invention. For this circuit, the potential drop across resistor R6, which is indicative of the actual current flowing through tube 2, is applied through a resistor R7 to an input 361 of a comparator 36 whose second input 362 is grounded. Further, the output of the voltage furnishing means 22 is applied through a resistor R8 in inverted form to the same input 361. Also applied to input 361 is a threshold signal furnished at a terminal 38 and applied to input 361 through a resistor R9. If the difference between the actual beam current and the desired beam current exceeds the threshold signal, comparator 36 furnishes an energizing signal to a relay 362 whose normally closed contacts 40 are in series with the cathode 4 of the beam furnishing tube 2 to interrupt the current through tube 2.

It should be understood, of course, that the foregoing disclosure relates only to preferred embodiments of the invention, and that it is intended to cover all changes and modifications of the examples of the invention herein chosen for the purpose of the disclosure which do not constitute departures from the spirit and scope of the invention set forth in the appended claims.

What is claimed is:

1. In an electric welder including a source of high voltage having first and second output terminals, a voltage divider connected in parallel to said source of high voltage, said voltage divider having a tap, beam furnishing means having an anode connected to said second output terminal and a cathode-control electrode circuit connected from said tap to said first output terminal for furnishing an electron beam having a current varying as a function of the voltage across said cathode-control electrode circuit, apparatus for controlling said current, comprising, in combination:

desired beam current signal furnishing means connected to ground potential for furnishing a desired beam current signal under external control;

controllable impedance means connected in parallel with said cathode-control electrode circuit of said beam furnishing means, said controllable impedance means having an impedance control electrode for varying the impedance from said voltage divider tap to said first output terminal as a function of an impedance control signal applied to said impedance control electrode;

actual beam current signal furnishing means connected in series with said beam furnishing means for furnishing an actual beam current signal indicative of the actual beam current furnished by said beam furnishing means; and comparator means interconnected between said actual beam current signal furnishing means, said desired beam current signal furnishing means, and said impedance control electrode for comparing said desired beam current signal to said actual beam current signal and for furnishing said impedance control signal to said impedance control electrode as a function of the difference between the compared signals.

2. Apparatus as set forth in claim 1, wherein said actual beam current signal furnishing means comprises a resistor connected to said beam furnishing means and means for applying the voltage across said resistor to said comparator.

3. Apparatus as set forth in claim 1, wherein said beam furnishing means has an anode connected to ground potential, a control electrode connected to said first output terminal, and a cathode; the apparatus further comprising unidirectional conducting means connected between said cathode and said tap of said voltage divider means for blocking current flow from said tap of said voltage divider means to said controllable impedance means during operation of said welder.

4. Apparatus as set forth in claim 3, wherein said unidirectional conducting means comprises a diode.

5. Apparatus as set forth in claim 1, wherein said desired beam current signal furnishing means comprises input voltage furnishing means for furnishing an input voltage having an amplitude corresponding to said desired beam current, voltage/frequency converter means connected to said voltage furnishing means for furnishing a converter output signal having a frequency varying as the function of the amplitude of said input voltage, light-emitting means connected to said voltage/frequency converter means for furnishing a light signal modulated by said converter output signal, photo receiver means positioned to receive light from said light-emitting means and furnishing a corresponding electrical frequency modulated signal, and frequency/voltage converter means connected to said photo receiver means and said comparator means for furnishing said desired beam current signal in response to said electrical frequency modulated signal.

6. Apparatus as set forth in claim 1, wherein said desired beam current signal furnishing means comprise input voltage furnishing means operative under external control, for furnishing an input voltage, analog/digital converter means connected to said input voltage furnishing means for converting said input voltage to a corresponding digital signal, light-emitting means connected to said analog/digital converter means for furnishing light signals corresponding to said digital signals, photo receiver means positioned to receive said light signals for furnishing digital electrical signals in response thereto, and digital/analog converter means connected to said photo receiver means for furnishing said desired beam current signal in response to said electrical digital signals.

7. Apparatus as set forth in claim 5, further comprising photo conductor means coupling said light emitting means to said photo receiver means.

8. Apparatus as set forth in claim 7, wherein said photo conductor means comprises a glass rod, a reflecting casing enclosing said glass rod, and an oil tank enclosing said reflecting casing.

9. Apparatus as set forth in claim 5, wherein said input voltage furnishing means comprise means for furnishing a constant voltage, means for furnishing a timed voltage having an adjustable leading edge and trailing edge, and modulator means for modulating said constant voltage with said timed voltage.

10. Apparatus as set forth in claim 5, wherein said input voltage furnishing means comprises a pulse generator.

11. Apparatus as set forth in claim 1, wherein a portion of said beam current passes through a workpiece being welded; further comprising means connected to said desired beam current signal furnishing means for varying said desired beam current signal as a function of said portion of said beam current.

12. Apparatus as set forth in claim 1, further comprising overcurrent protection circuit means connected to said beam furnishing means, said actual beam current signal furnishing means and said desired beam current signal furnishing means, for disconnecting said beam furnishing means from said source of high voltage when the difference between said actual beam current signal and said desired beam current signal exceeds a predetermined difference.

\* \* \* \* \*